US006590218B1

(12) United States Patent
Suzuki

(10) Patent No.: US 6,590,218 B1
(45) Date of Patent: Jul. 8, 2003

(54) PROJECTION-EXPOSURE METHODS AND APPARATUS EXHIBITING INCREASED THROUGHPUT

(75) Inventor: Kazuaki Suzuki, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/461,156

(22) Filed: Dec. 14, 1999

Related U.S. Application Data

(62) Division of application No. 09/265,047, filed on Mar. 9, 1999, now abandoned.

(51) Int. Cl.[7] ............................................. H61J 37/304
(52) U.S. Cl. ................................................. 250/492.2
(58) Field of Search ............................. 430/5, 30, 22; 250/491.1, 396 ML, 492.23, 492.2

(56) References Cited

U.S. PATENT DOCUMENTS

| | | | |
|---|---|---|---|
| 5,620,814 A | | 4/1997 | Kley |
| 5,874,198 A | * | 2/1999 | Okino ........................ 430/296 |
| 5,879,842 A | | 3/1999 | Okino |
| 5,981,118 A | | 11/1999 | Yasutake et al. |
| 6,087,669 A | * | 7/2000 | Suzuki .................. 250/492.23 |
| 6,124,596 A | * | 9/2000 | Nakasuji et al. ..... 250/396 ML |
| 6,180,289 B1 | * | 1/2001 | Hirayanagi ..................... 430/5 |
| 6,204,509 B1 | * | 3/2001 | Yahiro et al. ............. 250/491.1 |

OTHER PUBLICATIONS

Buckley et al., "Step and Scan: A Systems Overview of a New Lithography Tool," SPIE 1088:424–433 (1989).

* cited by examiner

Primary Examiner—Jack Berman
Assistant Examiner—Johnnie L Smith, II
(74) Attorney, Agent, or Firm—Klarquist Sparkman LLP

(57) ABSTRACT

Projection-exposure apparatus and methods are disclosed that exhibit increased throughput by providing improved schemes by which the reticle stage and wafer stage move to accomplish exposure. Portions of a die pattern on a "pattern original" (e.g., reticle) are sequentially illuminated by an energy beam (e.g., beam of electromagnetic radiation or charged particles). The energy beam passes through the pattern portions and forms a demagnified image on a substrate through a projection-optical system. While moving the pattern original and the substrate, the entire die pattern is sequentially illuminated according to an exposure order, and the die pattern is demagnifyingly transferred to the substrate on which the images of the illuminated pattern portions are stitched together. When transferring and exposing the die pattern to multiple locations on the substrate, the exposure order is reversed after exposing each die pattern.

5 Claims, 5 Drawing Sheets

PROJECTION-EXPOSURE METHODS AND APPARATUS EXHIBITING INCREASED THROUGHPUT

CROSS REFERENCE TO RELATED APPLICATION

This application is a divisional of, and claims priority to, U.S. patent application Ser. No. 09/265,047, field Mar. 9, 1999 now abandoned.

FIELD OF THE INVENTION

The present invention pertains to microlithographic projection-exposure methods and apparatus for use principally in the manufacture of semiconductor integrated circuits and display devices. In such methods and apparatus, a pattern for a circuit or display array is defined by a reticle or the like and is projected onto a semiconductor wafer or other suitable substrate using an energy beam so as to transfer the pattern to the substrate.

BACKGROUND OF THE INVENTION

In conventional projection-microlithographic techniques, a pattern (e.g., for a semiconductor chip or display device) is defined on a reticle or other suitable "original plate". At least a portion of the reticle is illuminated using an energy beam. As the energy beam passes through the reticle, the beam carries an image of the illuminated portion. The image is focused onto a corresponding region of a suitable substrate (termed herein a "wafer"). The wafer is normally coated with an appropriate resist that is imprinted with the projected image.

As used herein, "throughput" means the number of wafers, product devices, or other product units that can be manufactured per unit time using the subject method or apparatus; a "pattern original" is a plate, film, or the like that defines a pattern to be transferred to a substrate and encompasses masks, reticles, and analogous structures; an "energy beam" is a medium used to transfer an image of the pattern from the pattern original to the substrate and encompasses visible light, ultraviolet light, X-rays, electron beam, and ion beam; and a "charged particle beam" can be an electron beam, ion beam, or analogous beam. Hence, an "optical system" as referred to herein is not limited to an optical system for light (e.g., visible light, ultraviolet light, X-rays), but also encompasses optical systems for a charged particle beam.

As used herein, a "field of view" of an optical system or the like is, unless otherwise specified, an imaging region in which aberrations are within specification.

At present, projection-microlithographic exposures made in the mass-production of semiconductor chips are mainly performed using a "stepper" that utilizes visible light or ultraviolet light as the energy beam. As feature sizes have continued to decrease with the need to achieve increasingly higher circuit densities on semiconductor chips and displays, the wavelength of light used as the exposure energy beam in steppers is becoming increasingly shorter. This has placed severe limits on the optical materials that can be used in the optical systems (e.g., illumination-optical systems and projection-optical systems) in contemporary steppers.

Aberrations impose limitations to the field of view of optical systems that must satisfy a requirement for high resolution. I.e., whenever fine features must be transferred with high resolution, optical systems exhibiting excessive aberrations have a field of view that is confined to more paraxial regions compared to otherwise similar optical systems in which aberrations are better corrected.

In addition to demands for increased resolution, there is also a demand for ever larger semiconductor devices. Whereas meeting such demands could be achieved using correspondingly larger optical systems, larger optical systems capable of achieving high resolution are more difficult to manufacture to close tolerances than smaller optical systems. Hence, optical systems tend to have a field of view that is too small to project the entire pattern in one "shot".

Therefore, especially when higher integration densities and/or larger devices are the-goal, exposing the entire pattern simultaneously with a single exposure "shot" is impractical. To make exposures in such situations, exposure methods have been derived during which the reticle and the wafer are synchronously scanned as in the so-called "lens-scanning" methods.

Exposure using a charged particle beam (e.g., electron beam) offers prospects of higher resolution than obtainable using visible or ultraviolet light. Unfortunately, conventional charged-particle-beam (CPB) exposure systems exhibit low throughput because of the impracticality of exposing the entire pattern simultaneously in one exposure "shot". Various approaches have been devised to increase throughput of such systems. One conventional approach is termed "cell projection" which involves combining exposures of limited types of pattern portions. (This technique is also termed a "character projection" method.) Unfortunately, this method exhibits a throughput that is inadequate for practical use in the mass-production of semiconductor chips.

Another conventional approach is a "reduction" (i.e., producing a demagnified image on the wafer relative to the pattern on the reticle) projection-exposure method utilizing an electron beam. This method is disclosed, e.g., in Japanese Kokai patent document no. JP H05-160012. To increase throughput, an electron beam irradiates a reticle defining a circuit pattern for one entire semiconductor chip (i.e., an entire "die"). A demagnified image of the die pattern is transferred to the wafer using a projection lens. In most instances, an extremely large projection-lens field would be required to simultaneously projection-expose the entire die in a single shot. Unfortunately, aberration control over such a large field of view is extremely difficult to achieve with CPB optical systems. Hence, exposure is normally performed by dividing the pattern on the reticle into multiple pattern portions. The pattern portions are successively transferred in an ordered manner from the reticle to the wafer. During each exposure, one or more parameters of the charged particle beam can be changed as required to obtain the best aberration reduction for each exposure. The images on the wafer are "stitched" together by appropriate positioning during exposure to form the entire reticle pattern on the wafer. Certain methods utilizing this approach are termed "step-and-scan" methods or "divided" projection-transfer methods, as disclosed, for example, in U.S. Pat. No. 5,260,151.

Currently, CPB projection-exposure apparatus for mass production utilizing the "step-and-scan" method are not generally available. Also, CPB projection-exposure apparatus utilizing "divided" projection-transfer methods are still in development. In any event, utilizing such methods for forming a plurality of semiconductor chips on a wafer typically requires that the reticle stage be moved over distances (each separate movement consuming a certain amount of time) that prohibit the attainment of satisfactory throughput levels.

Certain types of scanning-type exposure apparatus for mass production are currently available in which the reticle stage exhibits one-dimensional movement. With such apparatus, changing the scanning direction for various die patterns can be performed. However, stitching together of portions of a die pattern as projected onto the wafer to form larger chips has not yet been practicably realized.

SUMMARY OF THE INVENTION

In view of the shortcomings of conventional technology as summarized above, an object of the present invention is to provide projection-exposure methods and apparatus that exhibit improved throughput. Such an object is achieved by certain improvements in the manner in which the reticle stage and wafer stage (on which the reticle and wafer, respectively, are mounted during exposure) undergo movement during exposure.

According to a first aspect of the invention, methods are provided for projection-exposing a die pattern, defined by a pattern original and comprising multiple pattern portions for individual exposure, onto multiple locations on a substrate. According to a representative embodiment of such a method, an energy beam is directed to impinge on a pattern portion of the die pattern defined by the pattern original, and to form a patterned beam from the energy beam passing through and propagating downstream of the illuminated pattern portion. (The patterned beam carries an image of the illuminated pattern portion.) The patterned beam is directed to form the image of the illuminated pattern portion on the substrate. This scheme is repeated, in a first exposure order, as required for each of the remaining pattern portions of the die pattern so as to expose an image, comprising stitched-together images of the pattern portions, of the die pattern at a first location on the substrate. Upon transitioning to the next location on the substrate on which the die pattern is to be formed, the foregoing scheme is repeated, but according to a second exposure order that is different (e.g., reversed) from the first exposure order. Thus, an image of the die pattern is exposed at a second location on the substrate.

The pattern original is typically mounted on a first movable stage (i.e., the "pattern-original stage" such as a reticle stage) and the substrate is mounted on a second movable stage (i.e., the "substrate stage") axially displaced from the first movable stage. The first and second stages can be operable to synchronously move the pattern original and substrate, respectively, to scanningly expose each pattern portion. In addition, the first and second stages can be operable to step the pattern original and substrate, respectively, after exposing each pattern portion so as to position the pattern original and substrate, respectively, for exposure of the subsequent pattern portion.

The image of the illuminated pattern portion formed on the substrate is typically a demagnified image. Also, the energy beam can be a beam of electromagnetic radiation such as visible light, ultraviolet light, or X-rays; or a charged particle beam such as an electron beam or ion beam.

The die pattern can be divided into multiple pattern portions arranged on the pattern original. In such an instance, each pattern portion can be sequentially projected, as an exposure unit, and exposed onto the substrate using the energy beam. The pattern original is stepped to a subsequent pattern portion after exposing each pattern portion of the die pattern.

The pattern portions of the die pattern can be arranged in a two-dimensional array on the pattern original. With such an array, the first exposure order can include stepping the pattern original and the substrate in two dimensions so as to expose the die pattern at the first location on the substrate.

The pattern original can remain stationary while the substrate is moved to position the substrate to begin exposure of the die pattern at the second location. Such elimination of certain movements of the pattern original can substantially reduce exposure time per wafer and thus increase throughput.

The energy beam impinging on each pattern portion of the pattern original typically passes through an illumination optical system having a field of view. The die pattern on the pattern original can then be divided into multiple pattern portions each falling within the field of view. With such a scheme, each pattern portion can be sequentially projected, within the field of view, and exposed onto the substrate using the energy beam. The pattern original is stepped to a subsequent pattern portion and the substrate is stepped to a subsequent exposure location for the subsequent pattern portion after exposing each pattern portion of the die pattern.

Alternatively, the die pattern on the pattern original can be divided into multiple pattern portions each having a dimension greater than a corresponding dimension of the field of view. In such an instance, the pattern original and the substrate can be synchronously scanned during exposure of each pattern portion. The pattern original and the substrate are stepped during each transition from exposure of one pattern portion to exposure of a subsequent pattern portion of the die pattern. In the second exposure order, exposure of the pattern portions of the die pattern is performed according to an order that can be opposite the first exposure order. Also, scanning exposure of each pattern portion can be in a direction opposite a direction in which scanning exposure was performed of the corresponding pattern portion in the first exposure order.

The energy beam can be passed through an illumination optical system that directs the energy beam to impinge on each pattern portion, and the patterned beam can be passed through a projection-optical system that directs the patterned beam to corresponding exposure regions on the substrate. In such an instance, the pattern original can be mounted on a first movable stage and the substrate can be mounted on a second movable stage axially displaced from the first movable stage. The first and second stages synchronously move the pattern original and substrate, respectively, as required to expose each pattern portion. If the energy beam is a charged particle beam, the illumination-optical system directs the charged particle beam and the projection-optical system directs the patterned beam and forms an image of the illuminated pattern portion by one or more of electrical and magnetic action that deflects the charged particle beam. Deflection of the charged particle beam on the pattern original and deflection of the patterned beam on the substrate are performed in coordination with movement of the first and second movable stages.

The methods according to the invention include methods in which, whenever a pattern portion is projected outside the substrate, actual exposure of the pattern portion is omitted.

According to another aspect of the invention, projection-exposure apparatus are provided. A representative embodiment of such an apparatus comprises the following: a movable substrate stage on which a substrate is mounted for exposure, a movable pattern-original stage on which a pattern original is mounted for exposure, an illumination optical system situated axially upstream of the pattern-original stage, a projection-optical system situated between the pattern-original stage and the substrate stage, and a controller. The pattern original defines a die pattern to be transferred to multiple locations on the substrate, wherein the die pattern is divided into multiple pattern portions. The pattern-original stage is situated axially downstream of the substrate stage. The illumination-optical system has a field of view and is operable to direct an energy beam so as to illuminate a pattern portion aligned with the field of view. The projection-optical system is operable to form, from the energy beam passing through an illuminated pattern portion, a patterned beam that forms a demagnified image of the illuminate pattern portion on a corresponding exposure region on the substrate. The controller is connected to and operable to controllably operate the illumination-optical system, the pattern-original stage, the projection-optical system, and the substrate stage. The controller is programmed with a map providing the controller with operability to move the pattern-original stage and the substrate stage in at least one of a scanning and step-wise manner so as to sequentially illuminate the pattern portions on the pattern original. The map also provides the controller with operability to control the demagnifying projection of the pattern portions onto corresponding exposure regions of the substrate according to an exposure order while stitching together images of the pattern portions on the exposure regions to form the die pattern on the substrate. The map also provides the controller with operability to change (e.g., reverse) the exposure order of the pattern portions with every sequentially new die being exposed on the substrate.

As noted above, the energy beam can be a charged particle beam. In such an instance, each of the illumination-optical system and the projection-optical system preferably comprises a respective deflector and respective lens that deflect and form an image, respectively, of the charged particle beam by at least one of electric and magnetic action. Deflection of the charged particle beam to illuminate a pattern portion on the pattern original and deflection of the patterned beam on the substrate can be performed in coordination with movement of the substrate stage and the pattern-original stage.

The die pattern can be divided into multiple pattern portions wider than the field of view. In such an instance, the pattern-original stage and the substrate stage can be operable to scanningly move the pattern original and the substrate, respectively, synchronously during each exposure of a pattern portion, and to steppingly move the pattern-original and the substrate, respectively, during a transition from exposure of a previous pattern portion to a subsequent pattern portion. Upon completion of exposure of each die on the substrate, the exposure order of each pattern portion of the die pattern can be reversed and the scanning direction of each pattern portion of the die pattern can be reversed.

In conventional stitching methods or scanning methods of exposure, by producing a demagnified image on the substrate, the pattern original and substrate undergo controlled movement during exposure of each die pattern. During exposure, the distance over which the pattern original moves is longer than the distance over which the substrate moves. According to the invention, by changing or reversing the exposure order with each new exposure of the die pattern on the substrate, the time required to move the pattern original can be minimized, thereby increasing throughput.

In this specification, the concept of "linking" or "stitching" together images of pattern portions on the substrate encompasses situations in which an image at a certain instant and an image at a subsequent instant are transferred by scanning onto the substrate while suitably overlapping the images.

The foregoing and additional features and advantages of the invention will be more readily apparent from the following detailed description, which proceeds with reference to the accompanying drawings.

DETAILED DESCRIPTION

Figure 9:
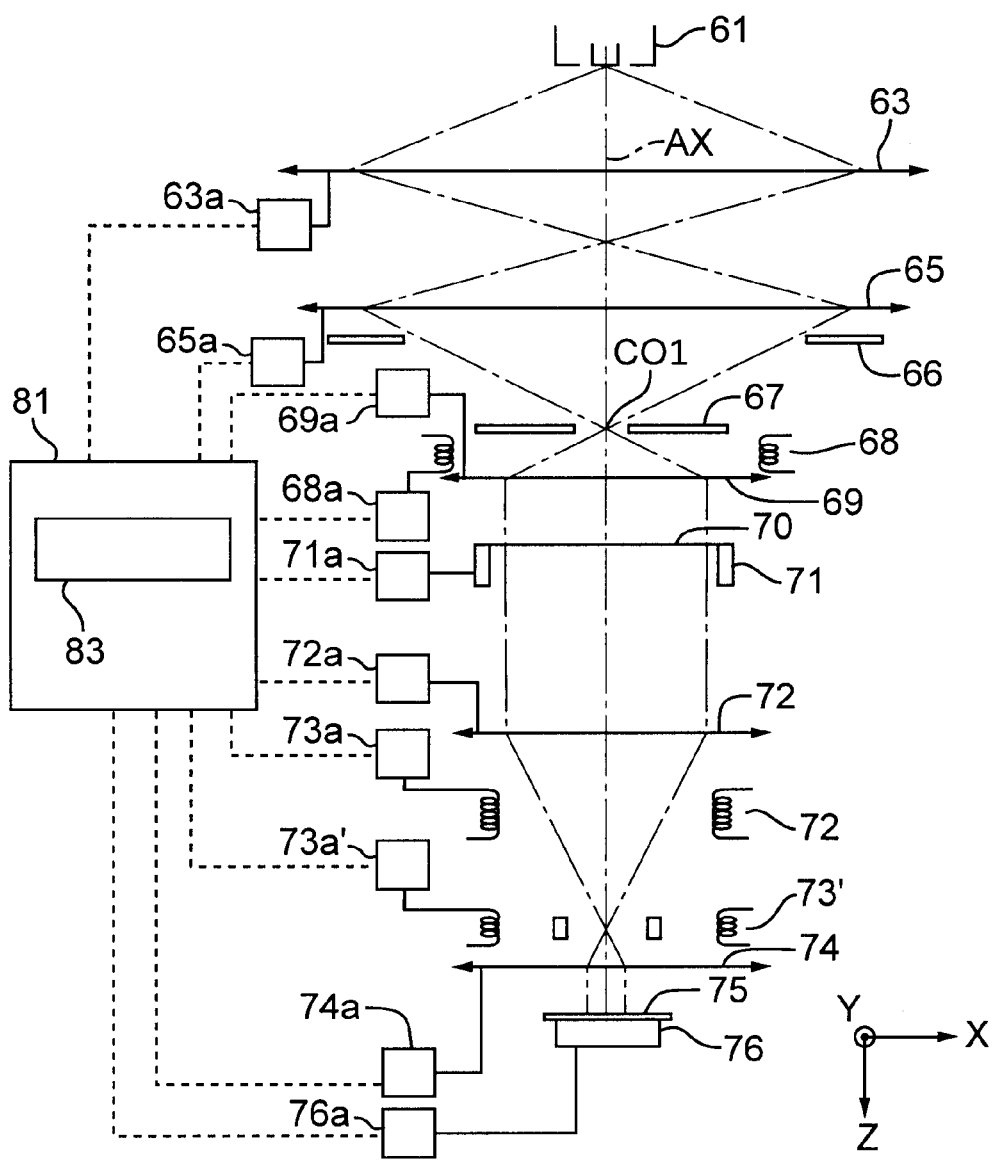
FIG. 9 shows certain image-forming relationships in an optical system of a projection-exposure apparatus (e.g., electron-beam projection-exposure apparatus) according to a representative embodiment.

Certain image-forming relationships of an optical system in a projection-exposure apparatus according to the invention are depicted in FIG. 9. In FIG. 9, an electron beam is used as an exemplary charged particle beam. The electron beam is produced by an electron gun 61 from which the electron beam propagates in a downstream direction along an optical axis AX. The electron beam forms a first crossover immediately downstream of the electron gun 61. A first condenser lens 63 and a second condenser lens 65 are situated downstream of the electron gun 61. The electron beam passes through the condenser lenses 63, 65 and forms an image of the electron-gun crossover at a blanking aperture 67.

A beam-shaping aperture 66 (preferably rectangular in profile) is situated downstream of the second condenser lens 65. The beam-shaping aperture 66 serves to define an "illumination field of view"; i.e., the beam-shaping aperture allows a portion of the electron beam to pass therethrough that can illuminate only one exposure region (one pattern portion) of a reticle 70 (as a representative pattern original). For example, the beam-shaping aperture 66 can be profiled so as to trim the electron beam to have a square-shaped transverse profile of which each side measures just over 1 mm. An image of the beam-shaping aperture 66 is formed on the reticle 70 by a third condenser lens 69. The condenser lenses 63, 65, and 69 collectively form an "illumination optical system."

The blanking aperture 67 is situated downstream of the beam-shaping aperture 66 at the axial location of a crossover C01. A deflector 68 is situated immediately downstream of the blanking aperture 67 for selecting a desired pattern portion within the deflection area. For example, the deflector 68 can be used to scan the electron beam across the reticle 70 in the X-direction of FIG. 9 to successively illuminate each pattern portion with the beam. The third condenser lens 69 is situated just downstream of the deflector 68, and collimates the electron beam. The electron beam then strikes the reticle 70 as the beam forms an image of the beam-shaping aperture 66 on the reticle 70.

Although the reticle 70 is shown in FIG. 9 extending only a small distance across the optical axis AX, it will be understood that the reticle 70 typically extends further in the X-Y plane than shown. The reticle 70 defines a pattern (e.g., an entire chip pattern or "die") and is typically divided into multiple pattern portions that can be individually illuminated and exposed in an ordered manner to transfer the entire die pattern to a substrate ("wafer").

The reticle 70 is mounted on a reticle stage 71 that is movable in the X-Y plane. A wafer 75 (serving as the substrate to be exposed with the reticle pattern) is mounted on a wafer stage 76 movable in an X-Y plane downstream of the plane of the reticle. By synchronously scanning the reticle stage 71 and the wafer stage 76 in opposing Y-directions, pattern portions of the reticle pattern, arranged in the Y-direction, can be sequentially exposed. To ensure accurate placement for exposure, each of the reticle stage 71 and wafer stage 76 is provided with a respective laser interferometer or the like for obtaining accurate positional measurements of the respective stage. Thus, the images of the pattern portions of the reticle, as projected onto the wafer 75, are accurately placed relative to one another.

For projection of each image of the respective illuminated pattern portion of the reticle, projection lenses 72, 74 (wherein the projection lens 74 serves as an objective lens) are provided downstream of the reticle 70 along the optical axis AX. A deflector 73 is situated downstream of the projection lens 72. As the electron beam illuminates a particular pattern portion of the reticle 70, certain of the electrons pass through the reticle and thus carry an image of the illuminated pattern portion. The image-carrying electrons propagating downstream of the reticle 70 are focused onto the surface of the wafer by the projection lenses 72, 74. The electrons are also appropriately deflected by the deflector 73 to form the image at a desired location on the wafer 75.

The wafer 75 has an upstream-facing major surface that is coated with a suitable resist. The resist becomes imprinted with a respective projected image whenever a corresponding region of the wafer surface is exposed with an appropriate dose of electrons by the electron beam passing through the respective pattern portion on the reticle. Such exposure produces a demagnified image of the illuminated pattern portion of the reticle on the wafer 75. During such exposure, the wafer 75 is mounted on the wafer stage 76 which is movable in a direction perpendicular to the optical axis AX to ensure that each image is imprinted on the desired location on the wafer 75.

Each of the lenses 63, 65, 69, 72, 74 and each of the deflectors 68, 73, 73' are controlled (preferably independently) by a controller (e.g., computer) 81 through a respective coil power supply 63a, 65a, 69a, 72a, 74a, and 68a, 73a, 73a'. Movements of the reticle stage 71 and the wafer stage 76 are controlled (preferably independently) by the controller 81 via respective stage-drive motor controllers 71a, 76a. In addition to each pattern portion on the reticle 70 being sequentially illuminated, images of the pattern portions are accurately linked ("stitched") together on the wafer 76. Thus, a demagnified image of the entire die pattern is transferred onto the wafer 76.

A layout scheme ("map") defining specific locations on the wafer surface at which each die is to be exposed, the order in which the dies are exposed, the specific locations in each die at which the respective pattern portions are exposed, and the order in which the pattern portions are exposed in each die are stored in a map memory 83 typically located within the controller 81. The order in which the pattern portions are exposed in each die is normally reversed, according to the invention, when progressing from a just-completed die to the next die (to begin exposure) on the wafer. Details of a representative map will be described later in connection with FIG. 7.

Figure 1A:
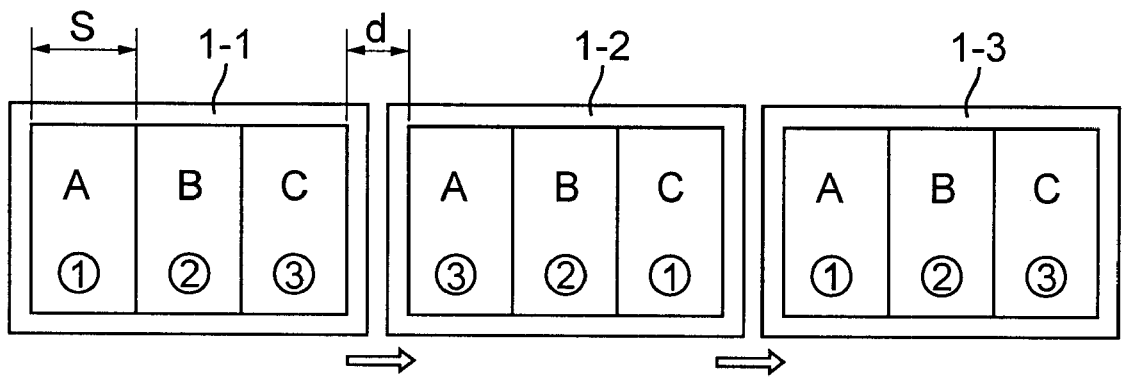
FIG. 1(a) depicts a projection-exposure method (involving one-dimensional stitching of projected pattern portions) according to a first representative embodiment of the present invention.
Figure 1B:
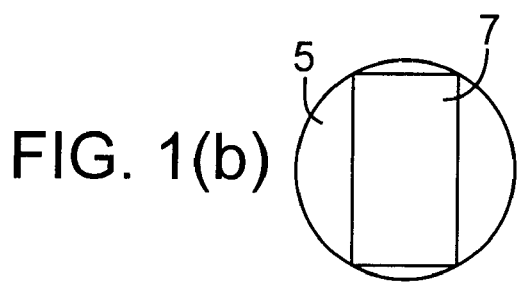
FIG. 1(b) shows the profile of a pattern portion, as shown in FIG. 1(a), relative to the field of view of the optical system used to make an exposure of the pattern portion on a substrate.

A first representative embodiment of an exposure order, according to the invention, is shown in FIG. 1(a). FIG. 1(a) also shows how pattern portions of the die pattern defined by the reticle, as projected onto the wafer, are stitched together to form complete dies. FIG. 1(a) depicts three identical dies 1-1, 1-2, 1-3 as formed on the wafer. Each die 1-1, 1-2, 1-3 comprises an image of each of three pattern portions A, B, C laterally linked ("stitched") together. The pattern portions A, B, C are separately defined on the reticle, and are individually and sequentially exposed onto the wafer in the order denoted by the circled numbers. As shown in FIG. 1(b), the field of view 5 of the optical system used to expose each pattern portion just encompasses the size of one pattern portion 7 (which can be any of the pattern portions A, B, or C).

When projecting and exposing the three dies shown in FIG. 1(a) onto the wafer, the exposure of the die 1-1 is performed by individually exposing the constituent pattern portions in the order A→B→C. The circled number inside each pattern portion denotes its respective position in the order of exposure. As each pattern portion is exposed in this embodiment, the reticle and the wafer are momentarily stationary. When shifting from one pattern portion to the next, the reticle stage and the wafer stage move stepwise in opposing directions in one dimension. Exposure is performed such that the respective images of the three pattern portions A, B, C are linked together contiguously in the proper order on the wafer. Such linking is termed "stitching" and is accomplished by accurately controlling the respective position of the wafer stage.

When exposure of the first die 1-1 is complete, a shifting motion of the wafer stage is made to the desired location of the second die 1-2. For the second die, exposure is performed by individually exposing the constituent pattern portions in the order C→B→A, which is opposite to the order in which the first die was exposed. In other words, the order in which pattern portions are exposed is reversed each time the exposure transitions to the next die on the wafer. More specifically, after the pattern portion C of the first die 1-1 is exposed, the reticle stage remains stationary at that position (to retain the pattern portion C within the field of view) as the wafer stage moves to the location at which the pattern portion C is to be exposed in the next die 1-2 (i.e., the wafer is positioned such that the center of the pattern portion C is aligned with the optical axis).

Thus, the reticle stage need not move when transitioning to expose the next die on the wafer. Rather, the wafer stage moves to position the next die for exposure. As a result of demagnification (relative to the reticle) of each projected die image on the wafer, the wafer stage moves a shorter distance than any corresponding movement of the reticle stage that would otherwise be necessary. As a result, the time required to prepare for exposure of the next die is shorter than if the reticle stage were moved after exposing each die.

An example of the timing characteristic of the FIG. 1 embodiment is set forth below using calculations, in which the width of each pattern portion A, B, C is denoted "S" and the gap between opposing edges of adjacent dies is denoted "d". The following variables are also defined:

$a_R$ average acceleration during each step movement of the reticle stage $v_R$ maximum velocity of the reticle stage $a_W$ average acceleration during each step movement of the wafer stage $v_W$ maximum velocity of the wafer stage $t_1$ acceleration/deceleration time $t_2$ running time at maximum speed The distance "L" over which a stage (reticle stage or wafer stage) moves is normally expressed as follows (wherein "a" is $a_R$ or $a_W$, respectively, and "v" is $v_R$ or $v_W$, respectively):

$$L = at_1^2/2 + vt_2 + at_1^2/2 = at_1^2 + vt_2$$

Because $v = at_1$, the following is true:

$$L = v^2/a + vt_2$$

Therefore, $$t_2 = L/v - v/a$$

The total movement time "T" is expressed as follows:

$$T = 2t_1 + t_2 = 2v/a + L/v - v/a = v/a + L/v$$

Whenever $L \leq v^2/a$, the stage velocity does not reach its maximum. Therefore, from $L = at_1^2/2 + at_1^2/2 = at_1^2$, the following is true:

$$T = 2t_1 = 2(L/a)^{1/2}$$

Example parameters are as follows:

$v_R$=500 mm/s $a_R$=0.5 G=4,900 mm/s$^2$ $v_W$=250 mm/s $a_W$=0.25 G=2,450 mm/s$^2$

S=10 mm (on wafer)

D=0.2 mm (on wafer)

Demagnification (M)=¼

Also, the non-patterned gap between the pattern portions A and B and between the pattern portions B and C on the reticle are ignored.

The time "t" to shift from one die to the next, [(A→B→C)→(C→B→A)], according to this embodiment, is determined as follows, wherein "$t_R$" is reticle-stage movement time and "$t_W$" is wafer-stage movement time:

$t_R$=0 sec $$t_W = (3S + d)/v_W + v_W/a_W$$

$$= 30.2/250 + 250/2,450$$

$$= 0.223 \text{ s}$$

Because $t_W > t_R$, t=0.223 s

In contrast, the time "t" to shift from one die to the next, [(A→B→C)→(A→B→C)], according to conventional practice in which the order of exposure of the small regions is not reversed from one die to the next, is determined as follows:

$$t_R = (2S/M)/v_R + v_R/a_R$$

$$= 80/500 + 500/4,900$$

$$= 0.262 \text{ s}$$

$$t_W = (d + S)/v_W + v_W/a_W$$

$$= 10.2/250 + 250/2,450$$

$$= 0.143 \text{ s}.$$

Because $t_R > t_W$, t=0.262 s

Therefore, the time to perform the shift from one die to the next is shorter with this embodiment than with the conventional method, thereby significantly improving throughput. In fact, the inventor has found that motions of the reticle stage (according to this embodiment) can be two-times faster, under certain conditions, than realized with conventional methods.

Figure 2A:
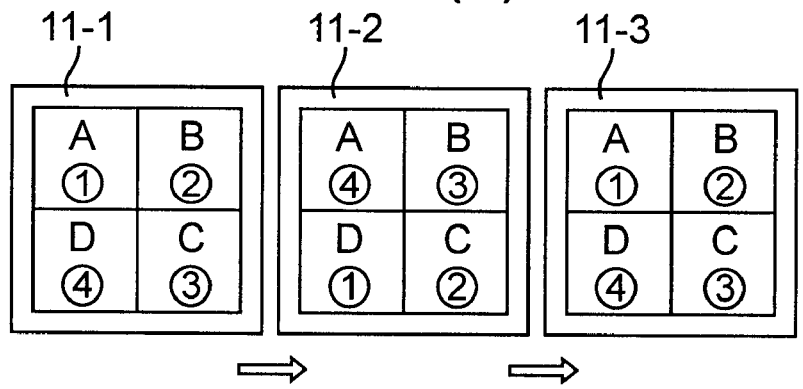
FIG. 2(a) depicts a projection-exposure method (involving two-dimensional stitching of projected pattern portions) according to a second representative embodiment.
Figure 2B:
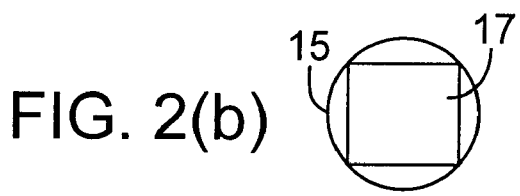
FIG. 2(b) shows the profile of a pattern portion, as shown in FIG. 2(a), relative to the field of view of the optical system used to make an exposure of the pattern portion on a substrate.

A second representative embodiment of an exposure order is shown in FIG. 2(*a*). In this embodiment, three dies 11-1, 11-2, 11-3 each comprising four pattern portions A, B, C, D (in a two-dimensional configuration) are shown on a wafer surface. The pattern portions are individually and sequentially exposed in manner resulting in the pattern portions being stitched together. As shown in FIG. 2(*b*), the field of view 15 of the optical system used to perform such exposures covers an area 17 equivalent to the size of one pattern portion A, B, C, or D.

In this embodiment, the first die 11-1 is exposed in the order A→B→C→D (order denoted by circled numbers), and the next die 11-2 is exposed in the order D→C→B→A. Thus, again, the reticle stage need not move when transitioning from a completed die to beginning exposure of the next die on the wafer, thereby shortening the time required to perform such a transition.

In this embodiment, the arrangement of the pattern portions defined by the reticle (regardless of their arrangement in each die as exposed) need not be two-dimensional as shown. The arrangement can alternatively be one-dimensional.

Figure 3A:
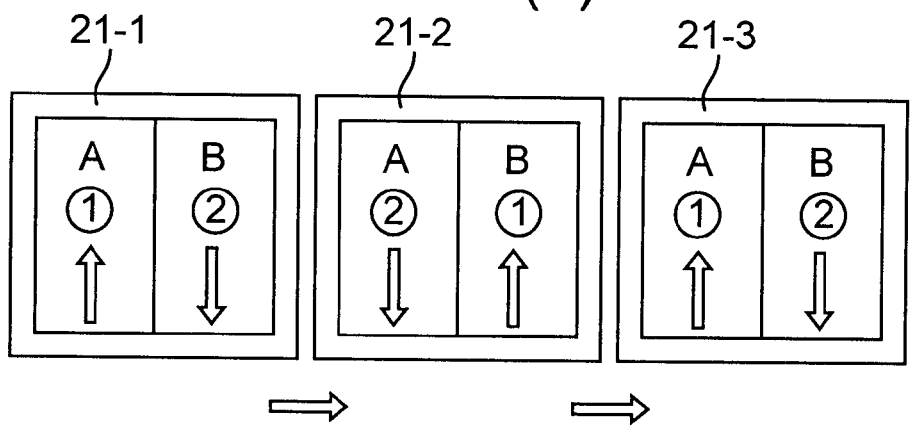
FIG. 3(a) depicts a projection-exposure method (involving one-dimensional stitching of projected pattern portions and one-dimensional scanning of each pattern portion for exposure) according to a third representative embodiment.

A third representative embodiment of an, exposure order is shown in FIG. 3(a). In this embodiment, three dies 21-1, 21-2, 21-3 each comprising two pattern portions A, B are shown on a wafer surface. In this embodiment, projection of each die is accomplished by a combination of one-dimensional stitching of projected pattern portions and one-dimensional scanning of each pattern portion.

Figure 3B:
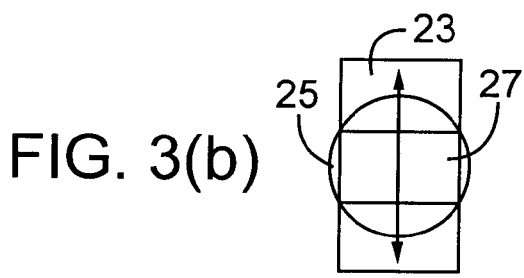
FIG. 3(b) shows the profile of a pattern portion, as shown in FIG. 3(a), relative to the field of view of the optical system used to make an exposure of the pattern portion on a substrate.

The relationship of each pattern portion (denoted "23") to the field of view 25 is shown in FIG. 3(b), wherein the length of each pattern portion 23 is longer than the field of view 25. This makes it impossible to expose any pattern portion 23 at one time; rather, the rectangular region 27 (having a width equal to the width of the pattern portion 23) falling within the field of view 25 must be scanned lengthwise (arrow in FIG. 3(b)) across the pattern portion 23.

According to this embodiment, the pattern portion A (FIG. 3(a)) of the first die 21-1 is scanningly exposed from the bottom to the top (in the figure) as indicated by the respective arrow. The adjacent pattern portion B is scanningly exposed from the top to the bottom (in the figure) as indicated by the respective arrow. Upon shifting to the adjacent die 21-2, the pattern portion B is first scanningly exposed from the bottom to the top in the figure as indicated by the respective arrow, and then the pattern portion A is scanningly exposed from the top to the bottom in the figure as indicated by the respective arrow. Thus, in addition to reversing (with each transition to the next die) the order in which the pattern portions within each die are exposed, the scan direction within each pattern portion is also reversed with every transition from one pattern portion to the next within a die and from die to die. By conducting exposures in this manner, wasted movement of the reticle stage is eliminated and throughput is increased.

Figure 4A:
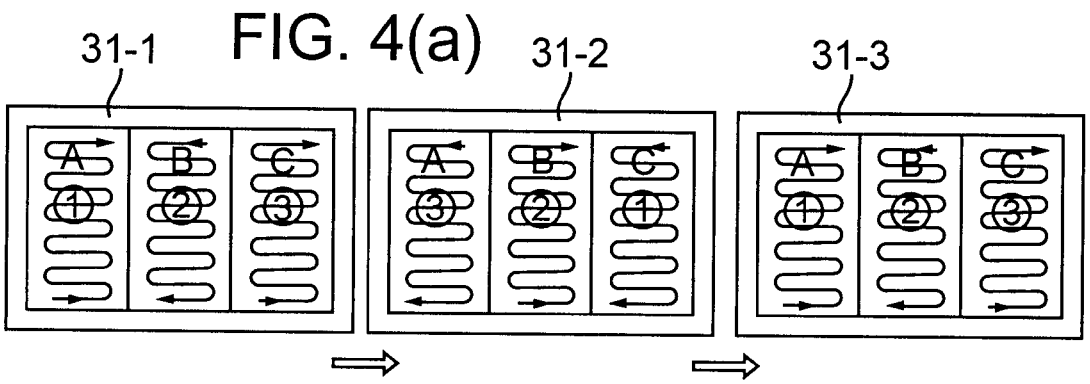
FIG. 4(a) depicts a projection-exposure method (involving two-dimensional stitching of projected pattern portions) according to a fourth representative embodiment.
Figure 4B:
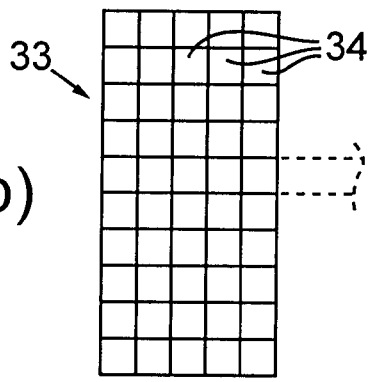
FIG. 4(b) shows a representative pattern portion as used in the fourth embodiment, the pattern portion being divided into multiple exposure subregions.

A fourth representative embodiment of an exposure order is shown in FIG. 4(a). In this embodiment, three dies 31-1, 31-2, 31-3 each comprising three pattern portions A, B, C are shown on a wafer surface. In this embodiment, one-dimensional stitching is performed after exposing each pattern portion A, B, C to form each die on the wafer. Each pattern portion A, B, C (denoted "33" in FIG. 4(b)) is divided into multiple exposure units 34 in a two-dimensional array.

Figure 4C:
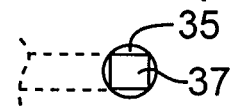
FIG. 4(c) shows the profile of a pattern portion, as shown in FIG. 4(a), relative to the field of view of the optical system used to make an exposure of the pattern portion on a substrate.

As shown in FIG. 4(c), the field of view 35 of the optical system has a diameter sufficient to cover an individual exposure unit 37. As a result, the exposure units 34 in each pattern portion A, B, C are scanned individually in succession.

With respect to a particular pattern portion, scanning widthwise across the pattern portion using a charged particle beam is preferably performed by deflecting the beam. The lengthwise scanning required to expose successive rows of exposure units 34 is preferably performed by scanningly moving the reticle and wafer stages in a synchronous manner. Achieving scanning by deflecting the beam across the shorter dimension of each pattern portion is preferred for better throughput.

In this embodiment, the order in which the pattern portions are exposed is reversed from one die to the next (A→B→C)→(C→B→A). Also, the order in which the exposure units in each pattern portion are exposed is reversed with each transition from one pattern portion to the next in each die. For example, the exposure order in pattern portion A of die 31-1 progresses from the lower left to the upper right; the exposure order in pattern portion A of the next die 31-2 progresses from the upper right to the lower left. By conducting exposures in such a manner, wasted movement of the reticle stage is eliminated and throughput increased.

Figure 5:
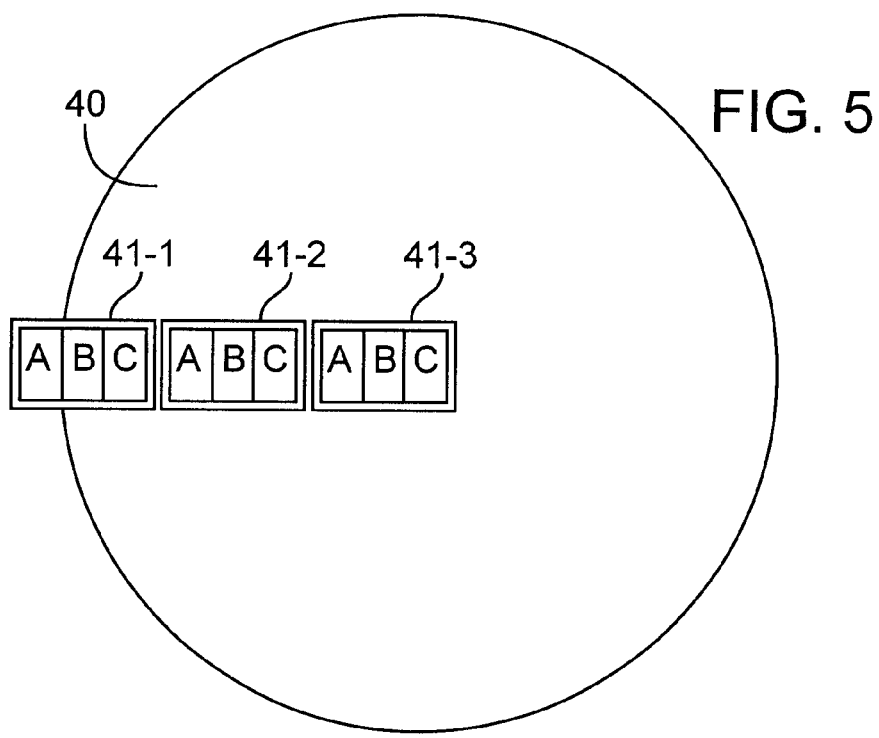
FIG. 5 depicts a projection-exposure method according to a fifth representative embodiment in which a pattern portion protruding over an edge of a wafer is not exposed.

A fifth representative embodiment of an exposure order is shown in FIG. 5, in which a portion of a die 41-1 extending outside the circumference of a wafer 40 is not exposed. I.e., the pattern portion A on the left side of the die 41-1 extends over the edge ("outside") of the wafer 40. For this die 41-1, exposure is not performed of the over-extending pattern portion A. By conducting exposures in this manner, wasted exposures are eliminated and throughput correspondingly increased. Any pattern portions B, C of the die 41-1 projectable on the wafer 40 can be exposed nevertheless to maintain uniformity by which the wafer is exposed overall, even though the die 41-1 ultimately will not be made into product.

Figure 6A:
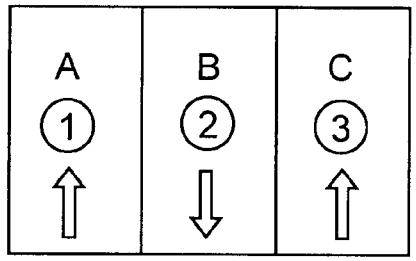
FIGS. 6(a)–6(d) show maps of respective representative exposure orders for a die containing three pattern portions (the exposure involving one-dimensional scanning and one-dimensional stitching of projected pattern portions).

Representative maps of a projection-exposure apparatus according to the invention will now be described. FIGS. 6(a)–6(d) depict respective representative orders of exposure of a die containing three pattern portions A, B, C (one-dimensional scan of each pattern portion A, B, C plus one-dimensional stitching of the pattern portions A, B, C together). The pattern portions A, B, C are stitched together in the horizontal direction in the figure. Each pattern portion A, B, C is scanningly exposed in the vertical direction in the figure (arrow) in the order (for each respective die) denoted by the respective circled number. For this example, the following four orders are possible:

FIG. 6(a): A (bottom→top)→B (top→bottom)→C (bottom→top)

Figure 6B:
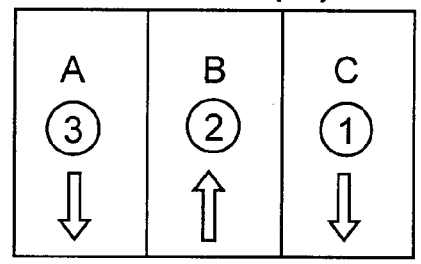

FIG. 6(b): C (top→bottom)→B (bottom→top)→A (top→bottom)

Figure 6C:
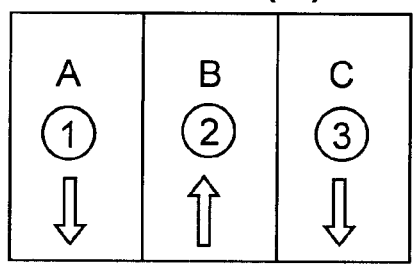

FIG. 6(c): A (top→bottom)→B (bottom→top)→C (top→bottom)

Figure 6D:
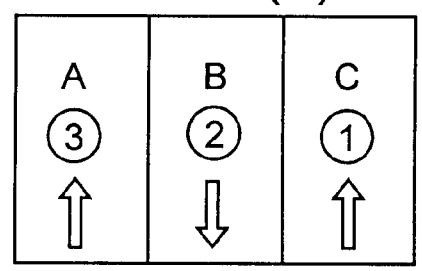

FIG. 6(d): C (bottom→top)→B (top→bottom)→A (bottom→top)

Figure 7:
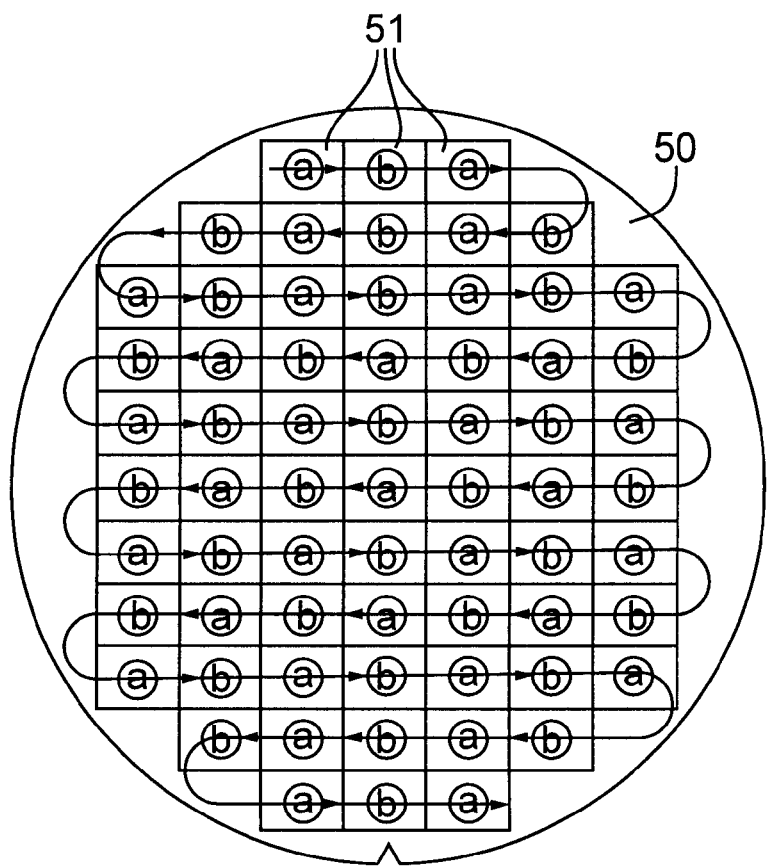
FIG. 7 shows another example of a map according to which multiple dies can be exposed, according to the invention, on one wafer.

FIG. 7 depicts another representative map in which multiple dies are exposed on the surface of a wafer 50. In this example, sequential exposure of successive dies is begun at the upper left and progresses in alternating left and right directions downward as exposure progresses across the wafer. In FIG. 7, the exposure order of regions of each die is indicated as a or b. A map such as this is stored inside the controller (computer) 81 of a projection-exposure apparatus (FIG. 9), wherein the controller 81 reverses the exposure order with every transition to the next die.

Figure 8:
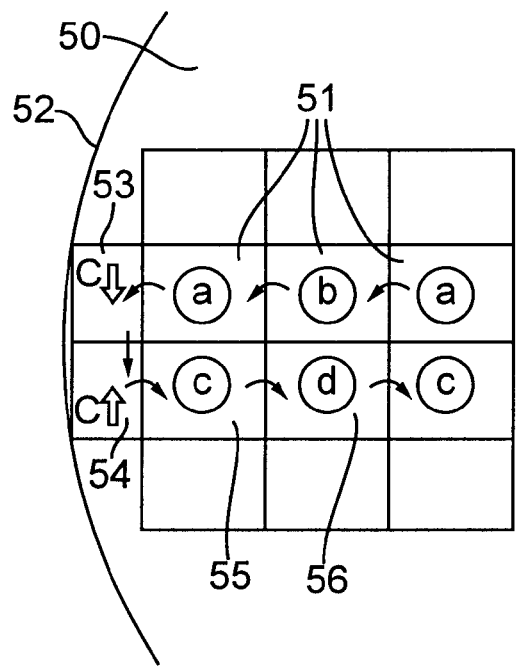
FIG. 8 shows yet another example of a map pertaining to an exposure order for multiple pattern portions of a die on one wafer, according to the invention, wherein exposure of a pattern portion extending over the edge of the wafer is not exposed.

FIG. 8 depicts another representative map, in which exposure of a particular pattern portion of a die on a wafer 50 is not made if the pattern portion as projected extends over the edge of the wafer. On the left side of the die, an upper portion 53 and a lower portion 54 extend over the wafer edge 52. For each such over-extending pattern portion, only the portion C is exposed onto the wafer. The upper pattern portion 53 is scanned and exposed from the top to the bottom (indicated by respective arrow); in contrast, the lower pattern portion 54 is scanned and exposed from the bottom to the top (indicated by respective arrow) Because the orders of exposure within the pattern portion C reverse when transitioning from one die to the next, the third exposure order "c" of FIG. 8 executes during the exposure of the next die 55 of the lower pattern portion C54. Then, the exposure order changes to exposure order "d" at the next die pattern 56. Thus, if an over-extending die exists, the four exposure orders of FIG. 6 are combined.

In general, for a die that comprises three pattern portions A, B, C, the following possible exposure orders are possible (wherein vertical arrows indicate scan direction and horizontal arrows indicate exposure order), yielding a total of sixteen different combinations:

No over-extending portions:
  (A↑)→(B↓)→(C↑)
  (A↓)→(B↑)→(C↓)
  (C↑)→(B↓)→(A↑)
  (C↓)→(B↑)→(A↓)

One over-extending portion (i.e. either C or A over-extending):
  (A↑)→(B↓)
  (A↓)→(B↑)
  (B↑)→(A↓)
  (B↓)→(A↑)
  (B↑)→(C↓)
  (B↓)→(C↑)
  (C↑)→(B↓)
  (C↓)→(B↑)

Two over-extending portions (either B and C, or A and B, over-extending):
  (A↑)
  (A↓)
  (C↑)
  (C↓)

As will be understood from the foregoing description, the present invention provides projection-exposure methods and apparatus exhibiting improved throughput resulting from improvements in the movement of the wafer and reticle stages.

Whereas the invention has been described in connection with multiple representative embodiments, it will be apparent that the invention is not limited to those embodiments. On the contrary, the invention is intended to encompass all alternatives, modifications, and equivalents as may be included within the spirit and scope of the invention as defined by the appended claims.

What is claimed is:

1. A projection-exposure apparatus, comprising;
   (a) a movable substrate stage on which a substrate is mounted for exposure;
   (b) a movable pattern-original stage on which a pattern original is mounted for exposure, the pattern original defining a die pattern to be transferred to multiple locations on the substrate, the die pattern being divided into multiple pattern portions, the pattern-original stage being situated axially upstream of the substrate stage;
   (c) an illumination optical system situated axially upstream of the pattern-original stage, the illumination-optical system having a field of view and being operable to direct an energy beam so as to illuminate a pattern portion aligned with the field of view;
   (d) a projection-optical system situated between the pattern-original stage and the substrate stage, the projection-optical system being operable to form, from the energy beam passing through an illuminated pattern portion, a patterned beam that forms a demagnified image of the illuminate pattern portion on a corresponding exposure region on the substrate; and
   (e) a controller connected to and operable to controllably operate the illumination-optical system, the pattern-original stage, the projection-optical system, and the substrate stage, the controller being programmed with a map providing the controller with operability to move the pattern-original stage and the substrate stage in at least one of a scanning and step wise manner so as to sequentially illuminate the pattern portions on the pattern original and demagnifyingly project the pattern portions onto corresponding exposure regions of the substrate according to an exposure order while stitching together images of the pattern portions on the exposure regions to form the die pattern on the substrate, the map also providing the controller with operability to change the exposure order of the pattern portions with every sequentially new die being exposed on the substrate.

2. The apparatus of claim 1, wherein the exposure order is reversed with every sequentially new die being exposed on the substrate.

3. The apparatus of claim 1, wherein;
   the energy beam is a charged particle beam;
   each of the illumination-optical system and the projection-optical system comprises a respective deflector and respective lens that deflect and form an image, respectively, of the charged particle beam by at least one of electric and magnetic action; and
   deflection of the charged particle beam to illuminate a pattern portion on the pattern original and deflection of the patterned beam on the substrate are performed in coordination with movement of the substrate stage and the pattern-original stage.

4. The apparatus of claim 2, wherein:
   the die pattern is divided into multiple pattern portions wider than the field of view, the pattern portions being arranged on the pattern original;
   the pattern-original stage and the substrate stage are operable to scanningly move the pattern original and the substrate, respectively, synchronously during each exposure of a pattern portion, and to steppingly move the pattern-original and the substrate, respectively, during a transition from exposure of a previous pattern portion to a subsequent pattern portion; and
   upon completion of exposure of each die on the substrate, the exposure order of each pattern portion of the die pattern being reversed and the scanning direction of each pattern portion of the die pattern being reversed.

5. The apparatus of claim 1, wherein:
   the die pattern is divided into multiple pattern portions arranged on the pattern original; and
   when at least one pattern portion is projected outside the substrate, actual exposure of the pattern portion is omitted.

* * * * *

UNITED STATES PATENT AND TRADEMARK OFFICE
CERTIFICATE OF CORRECTION

PATENT NO. : 6,590,218 B1
DATED : July 8, 2003
INVENTOR(S) : Suzuki

It is certified that error appears in the above-identified patent and that said Letters Patent is hereby corrected as shown below:

<u>Title page,</u>
Please insert the following:

-- [30]   Foreign Application Priority Data
       March 12, 1998 [JP] Japan................10-078589 --

<u>Colunm 2,</u>
Line 12, "the-goal" should be -- the goal --.

<u>Column 5,</u>
Line 11, "illuminate" should be -- illuminated --.

<u>Column 10,</u>
Line 54, "in manner" should be -- in a manner --.

<u>Column 14,</u>
Line 1, "illuminate" should be -- illuminated --.

Signed and Sealed this

Sixth Day of January, 2004

JAMES E. ROGAN
*Director of the United States Patent and Trademark Office*